United States Patent [19]

Nakayama et al.

[11] Patent Number: 4,585,537
[45] Date of Patent: Apr. 29, 1986

[54] PROCESS FOR PRODUCING CONTINUOUS INSULATED METALLIC SUBSTRATE

[75] Inventors: Takehisa Nakayama, Kobe; Kunio Nishimura, Kyoto; Kazunori Tsuge; Yoshihisa Tawada, both of Kobe, all of Japan

[73] Assignee: Kanegafuchi Kagaku Kogyo Kabushiki Kaisha, Osaka, Japan

[21] Appl. No.: 677,773

[22] Filed: Dec. 3, 1984

[30] Foreign Application Priority Data

Jan. 12, 1983 [JP] Japan .................................. 58-227244

[51] Int. Cl.[4] ............................................. C25B 11/04
[52] U.S. Cl. .................. 204/192 D; 427/38; 427/85; 427/91; 427/95
[58] Field of Search .................. 427/39, 38, 85, 91, 427/95; 204/192 D

[56] References Cited

U.S. PATENT DOCUMENTS 4,398,054 8/1983 Madan .......................... 427/39 X
4,438,723 3/1984 Cannella et al. ................ 427/39 X
4,461,689 7/1984 Diepers .......................... 427/39 X Primary Examiner—Bernard D. Pianalto
Attorney, Agent, or Firm—Armstrong, Nikaido, Marmelstein & Kubovcik

[57] ABSTRACT

A process for producing a continuous web of an insulated metallic substrate, comprising the steps of depositing an insulation layer on a continuous web of a metallic substrate by plasma CVD method or sputtering method, and depositing a back electrode on the insulation layer by sputtering method or vapor deposition method. According to the present invention, the insulated metallic substrate for a solar cell or printed circuit board can be produced in a continuous manner and in high productivity and quality.

15 Claims, 10 Drawing Figures

PROCESS FOR PRODUCING CONTINUOUS INSULATED METALLIC SUBSTRATE

BACKGROUND OF THE INVENTION

The present invention relates to a process for producing a continuous web of a metallic substrate having an electric insulation layer thereon and an apparatus for the process.

Heretofore, there has been used a solar battery comprising a plurality of solar cells formed on a substrate in a pattern and connected in series, and a printed circuit board having high heat resistance and low heat conductivity has also been used.

In such a solar battery, since the cells must be connected in series, it is necessary that adjacent cells are electrically insulated. For example, when a metallic substrate is used as a substrate for a solar cell, the substrate must be subjected to insulation treatment. Usually, such treatment comprises the steps of polishing the surface of a web of a metallic substrate which is rolled out, attaching a protective sheet thereto, cutting the web in a predetermined shape by etching or by press, removing the protective sheet, and then subjecting it to insulation treatment for formation of an insulation layer. On the thus formed insulation layer a patterned back electrode is formed by vapor deposition or sputtering. The back electrode may be formed over the surface, and then patterned by etching.

In the production process described above, the cut substrates must be handled one by one, which requires much time and labor, and many handling procedures decreases the yield and productivity. As considered from the operation in the individual processing steps, usually, a batch system is suitable for the production process.

When the active layers of a solar cell are formed, the substrate must be heated to a temperature as high as 200° to 350° C. and hence the insulation layer is required to be resistant at such temperature. For this reason, a resin having a good heat resistance such as a polyimide is used as a material for the insulation layer. The process for forming the insulation layer of the resin comprises the steps of coating a metallic substrate with a polyimide resin by spin coating or dipping, and heating the resin coating for curing the resin and for degassing. However, this process is very complicated and entails a high reject rate. Generally, the higher the layer forming temperature in the active layers of the solar cell, the higher the quality of the solar cell. However, in case of producing a solar cell by using the substrate having the insulation layer of polyimide resin, or the like, the layer forming temperature is at most 250° C. because cracks occur in the back electrode when subjecting the substrate to a higher temperature. Moreover, condensation takes place in the insulation layer of the resin during heating to emit $H_2O$ and impurities, whereby detracting from the performance of the solar cell.

Accordingly, use of the substrate having the insulation layer of the resin is not advantagous to produce a high quality solar cell.

The field of a printed circuit board calls for development of a printed circuit board in a form of an insulated metallic substrate in view of its heat resistance in soldering and of its low heat conductivity.

An object of the present invention is to provide a process for continuously forming an insulation layer of an inorganic insulation material and a back electrode on a metallic substrate and, if necessary, cleaning the substrate, patterning the back electorde and cutting the produced insulated substrate, whereby reducing time, cost, processing steps and labor while increasing yield, productivity, and heat resistance, and further improving the performance of the solar cell itself.

SUMMARY OF THE INVENTION

According to the present invention, there is provided a process for producing a continuous web of a metallic substrate having an electric insulation layer comprising the steps of depositing an insulation layer on a continuous web of a metallic substrate by plasma CVD method or sputtering method, and depositing a back electrode thereon by sputtering method or vapor deposition method in a continuous operation.

According to the present invention, there is also provided an apparatus for continuously producing a continuous web of a metallic substrate having an electric insulation layer, comprising a supply chamber for housing a continuous web of a metallic substrate and supplying the continuous web, a plasma chamber in which an insulation layer is deposited on the continuous web of the metallic substrate supplied from the supply chamber by plasma CVD method or sputtering method, a chamber in which a back electrode is formed on the insulation layer deposited on the metallic substrate by sputtering method or vapor deposition method, and a winding chamber in which the insulated substrate with the back electrode is wound and stored, said chambers being arranged in the above-mentioned order.

DETAILED DESCRIPTION

Figure 1:
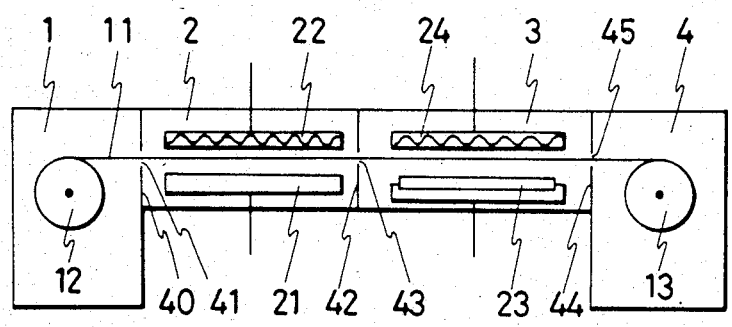
FIGS. 1 to 10 are schematic sectional views of different embodiments according to the present invention.

As the metallic substrate used in the present invention, there are employed a metal plate such as iron, aluminum, nickel, copper, zinc, an alloy thereof, stainless steel and brass, and a plate of a metal or a resin which is surface-treated with other metals such as aluminum and silver. The metallic substrate is preferably of a continuous web having a thickness of about 0.03 to 2.0 mm and a width of about 10 to 500 mm. The continuous web is preferably a hoop material in roll form from the standpoint of handling.

The surface of the metallic substrate is preferably polished by the usual method since the polishing treatment can prevent the insulation layer from adverse effects on the yield such as electrical contact through pin holes in the insulation layer. For increasing the yield more, a sophisticated treatment such as composite electrochemicalpolishing is preferably employed from the standpoint of improving the performance of the insulated substrate. If the yield is sacrificed to some extent, it is, of course, advantageous from the standpoint of cost to use an unpolished substrate whose $R_{max}$ is not more than 0.5 μm, for example, about 0.3 to 0.5 μm. When the surface roughness of a polished metallic substrate is $R_{max} \leq 0.3$ μm, if an insulation layer is deposited to an extent of about 2.0 μm, the occurrence of the above-mentioned electrical contact can be reduced to zero, as compared with the case of forming the same insulation layer on a substrate having a $R_{max}$ of about 0.5 μm. In the case of $R_{max} \leq 0.2$ μm, even if the thickness of the insulation layer is about 1.5 μm, the yield is the same as that in the case of using the substrate of $R_{max}=0.3$ μm and depositing the insulation layer of about 2.0 μm. If sophisticated composite electrochemicalpolishing which ensures $R_{max} \leq 0.05$ μm is applied to the substrate, perfect electric insulation can be obtained even if the insulation layer thickness is only 1 μm. In addition, the surface roughness is at least 0.005 μm from the standpoint of adhesion. If the surface roughness is less than 0.005 μm, there is a danger that the insulation layer is peeled off.

The insulation layer formed by the present invention is formed on the continuous metallic substrate by the usual plasma CVD method using silane gas alone or a suitable mixed gas prepared by mixing silane gas with a hydrocarbon gas such as methane or ethylene, ammonia gas, hydrogen and oxygen, or by the usual sputtering method using a mixed gas of an inert gas such as argon or helium with hydrogen, a hydrocarbon gas and a silicon-containing compound gas, and using a target made of SiC, graphite, silicon, or the like. The thickness of the insulation layer is not particularly limited, but is preferably about 0.1 to 200 μm, more preferably 0.5 to 20 μm.

The composition of the insulation layer is not particularly limited. From the standpoint of breakdown voltage, it is advantageous to employ a material having a wide band gap such as Si:H, $Si_{(1-x)}C_x$:H (wherein x is 0.1 to 0.9), $Si_{(1-x)}N_x$:H (wherein x is as defined above), $Si_{(1-x)}O_x$:H (wherein x is as defined above), $Si_{(1-x-y)}C_xN_y$:H (wherein x is as defined above, y is 0 to 0.9, and $x+y \leq 1$), or $Si_{(1-x-y)}C_xO_y$:H (wherein x and y are as defined above). Further, the insulation layer is preferably non-monocrystalline, particularly amorphous because of its structural flexiblility and resistance to cracks. From the standpoint of insulation, it is desirable to use a material having $10^{-6} \Omega.cm^{-1}$ or less, preferably $10^{-8} \Omega.cm^{-1}$ or less.

It is preferable that the insulation layer contains carbon atoms of not less than 10%. If the carbon content is less than 10%, the dielectric breakdown voltage decreases to 50 V/μm or less, which means insufficiency in point of insulating performance. If the carbon content is 30% or more, the dielectric breakdown voltage of the insulation layer further increases to 100 V/μm or more, which is preferable for a semiconductor device produced by glow discharge. A material for the insulation layer with a large carbon content is more preferable for use as an IC or printed circuit board since its heat conductivity is high.

Further, in case of using, as the plasma CVD method, a parallel plate electrode method, a method in which the substrate is set within ±3 cm from the plasma region, or a parallel plate electrode method in which an electrode involving a magnet arranged so as to give a magnetic field component being parallel to the electrode, damage to the deposited insulation layer due to plasma is very little, and hence an insulation layer with less defect can be obtained.

When the deposition of the insulation layer is carried out by raising the temperature to from 100° to 400° C., the layer can be increased in adhesive strength and heat stability, and internal stresses of the layer can be reduced. Further, if the dc potential difference (Vb) for plasma CVD method is 10 V or less, two sheets of insulated substrate can be produced at a time by using two hoop metallic webs and a set of plasma CVD electrodes.

In the present invention, after the insulation layer is formed on the metallic substrate, a back electrode is deposited thereon.

The back electrode is a mono layer or a multiple layer formed by the usual sputtering method using, as a target, a metal such as aluminum, nickel, chromium, molybdenum, silver, gold, copper or an alloy thereof, or an electrically conductive oxide such as ITO, $SnO_2$ or $Cd_xSnO_y$, or by the usual vapor deposition method in which the above-mentioned metal, alloy or electrically conductive oxide is heated by electron beam or by electric resistance. The thickness of the electrode is generally 200 Å to 100 μm, preferably 400 to 10000 Å.

The deposition of the back electrode by the sputtering method may be performed over the entire surface without using a mask or may be patterned by using a mask. When the deposition of the back electrode by the sputtering method is performed at a temperature of from room temperature to 400° C., the electrode thus formed has a low electric resistance and an increased adhesive strength.

The material of the back electrode is not particularly limited, and a conventional material for a back electrode can be employed. Examples of the materials of the back electrode are, for instance, a metal such as aluminum, chromium, nickel, molybdenum, SUS, silver, copper or gold; ITO; $SnO_2$: $Cd_xSnO_y$, and the like. For solar cells, there is preferably employed a back electrode comprising a first layer of aluminum, Ag, TiAg or Cr, which is coated with an electrically conductive film of an oxide such as ITO, $SnO_2$, $Cd_xSnO_y$ or a metal oxide ($TiO_2$, $Nb_2O_3$) in a thickness of not more than several ten Å, because of its high reflectance.

The present invention is more particularly described and explained by means of the following preferred embodiments with accompanied drawings. It is to be understood that the present invention is not limited to the embodiments and various changes and modifications may be made in the invention without departing from the spirit and scope thereof.

In FIG. 1, a continuous web of a metallic substrate 11 from a supply roll 12 installed in a supply chamber 1 is fed to a plasma chamber 2 through a slit 41 formed in a partition wall 40 continuously or intermittently at a rate of about 0.01 to 100 m/min. In the plasma chamber 2 there are installed an RF electrode 21 for depositing an insulation layer by plasma CVD method, a heater 22 for the substrate 11, and gas introducing means and gas exhausting means (not shown).

The metallic substrate 11 fed to the plasma chamber 2, while being heated by the heater 22, is moved toward a slit 43 in a partition wall 42. A mixed gas of the predetermined composition is being introduced into the plasma chamber 2 so that the gas pressure therein can be maintained at 0.01 to 10 Torr. The introduced gas is changed into plasma by a high frequency voltage of, e.g. 1 KHz to 100 MHz from the RF electrode and is deposited on the substrate 11 which is moving with heating, whereby an insulation layer is formed.

The metallic substrate 11 having the insulation layer thereon is fed to a sputtering chamber 3 through the slit 43. In the sputtering chamber 3 there are installed cathode electrode pair 23 consisting of a target and an anode, a heater 24 for the insulated substrate, and gas introducing means and gas exhausting means (not shown).

The insulated substrate 11 fed to the sputtering chamber 3, preferably while being heated by the heater 24, is moved toward a slit 45 in a partition wall 44. Argon gas or helium gas from the gas introducing means is introduced into the sputtering chamber 3 so that the gas pressure therein can be maintained at about $10^{-4}$ to 1 Torr. The introduced gas is changed into plasma with the anode of the electrode pair 23, and the gas plasma strikes the target to sputter atoms in the target into plasma. The sputtered atoms deposit on the insulation layer on the substrate 11 which is moving preferably with heating, whereby a back electrode is formed.

The insulated substrate 11 with the back electrode is passed through a slit 45 and wound on a winding roll 13 installed in a winding chamber 4.

Figure 6:
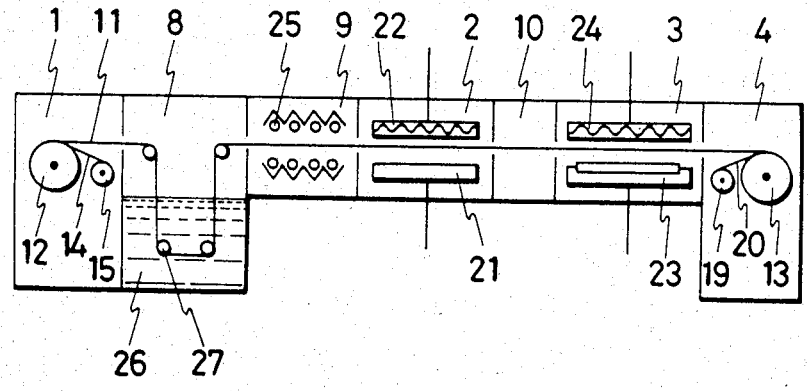

The apparatus shown in FIG. 1 may, if necessary, be provided with a cleaning chamber 8 and a drying chamber 9, as shown in FIG. 6, to clean the surface of the metallic substrate 11.

Figure 2:
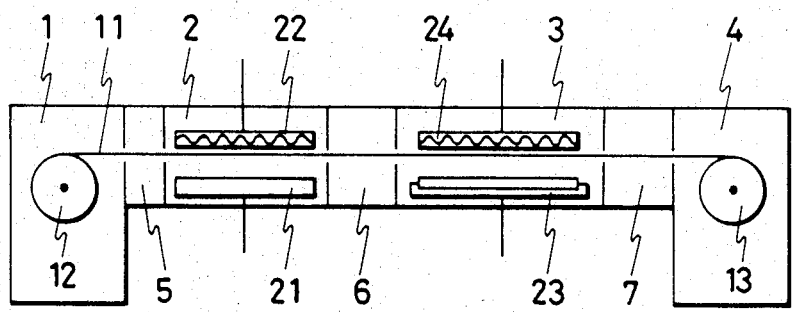

An apparatus shown in FIG. 2 has an intermediate chamber 5 provided between the supply chamber 1 and the plasma chamber 2, an intermediate chamber 6 provided between the plasma chamber 2 and the sputtering chamber 3, and an intermediate chamber 7 provided between the sputtering chamber 3 and the winding chamber 4 which can serve to exhaust the gases and to adjust the inner pressure. According to this embodiment, mutual diffusion of the gases from adjacent chambers can be prevented, and thus a product of high quality can be stably obtained. It is preferable that the pressures in the plasma chamber 2, sputtering chamber 3, and intermediate chambers 5, 6 and 7 are adjusted so that the pressure in the intermediate chamber is not more than $\frac{2}{3}$, preferably not more than $\frac{1}{2}$, more preferably not more than 1/10 of the pressure of one of the adjacent chambers which has a lower pressure.

The apparatus shown in FIG. 2 may, if necessary, be provided with the cleaning chamber 8 and the drying chamber 9, as shown in FIG. 6, for cleaning the surface of the metallic substrate 11.

Figure 3:
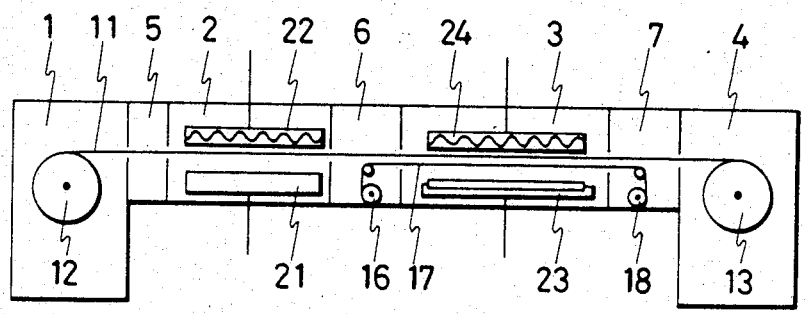

As shown in FIG. 3, the intermediate chamber 6 may be provided with mask supply means 16 for supplying a mask 17 and for relative positioning of the mask with the insulated substrate. The intermediate chamber 7 may be provided with mask winding means 18 for winding the mask 17 fed from the mask supply means 16. According to this embodiment, when the insulated substrate 11 is supplied to the sputtering chamber 3, the mask 17 positioned relative to the insulated substrate is also supplied to the sputtering chamber 3 so as to form a back electrode through the mask 17. This makes continuous production of patterned back electrodes possible.

Figure 4:
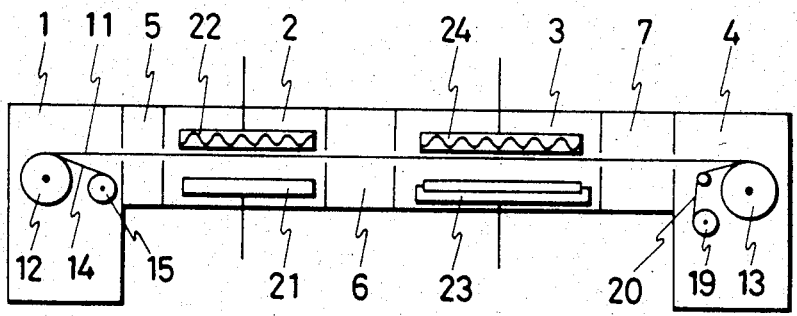

When using the continuous web of the metallic substrate 11 covered with a protective sheet, protective sheet winding means 15 for winding a protective sheet 14 may be installed in the supply chamber 1, as shown in FIG. 4. In this embodiment, the metallic substrate 11 covered with the protective sheet 14 can be used, and thus the metallic substrate having clean surface can be supplied without the cleaning treatment to the plasma chamber 2 while winding the protective sheet. Further, when, with the winding chamber 4, protective sheet supply means 19 for supplying a protective sheet 20 is provided, the insulated substrate with the back electrode is wound while supplying the protective sheet to give the product whose back electrode surface is protected.

Figure 5:
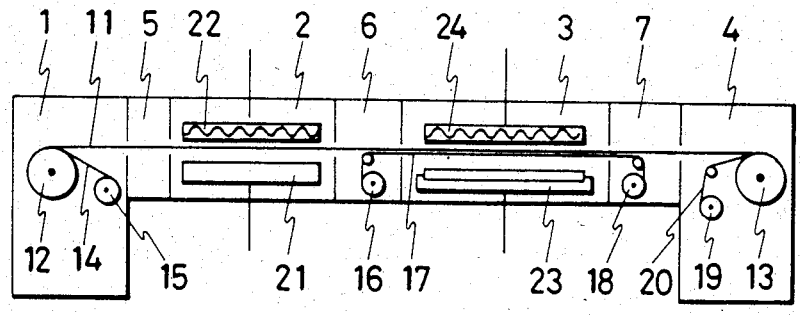

Also, as shown in FIG. 5, the mask supplying means 16 and mask winding means 18 shown in FIG. 3 may be assembled with the apparatus shown in FIG. 4. According to the apparatus, patterning is achieved during formation of the back electrode.

In addition, as shown in FIG. 6, before the metallic substrate 11 is supplied to the plasma chamber 2, it may be cleaned in the cleaning chamber 8 by the usual method, and dried in the drying chamber 9 by drying means 25 such as an infrared heater or a sheathed heater, if necessary subjectd to a plasma treatment with a gas such as nitrogen, hydrogen, argon or helium to clean the substrate surface. The cleaned substrate is supplied to the plasma chamber 2, the intermediate chamber 10 and the sputtering chamber 3 so as to form the insulation layer and the back electrode, and then wound. For the cleaning in the cleaning chamber 8, solvent vapor cleaning may be added to the usual cleaning.

Figure 7:
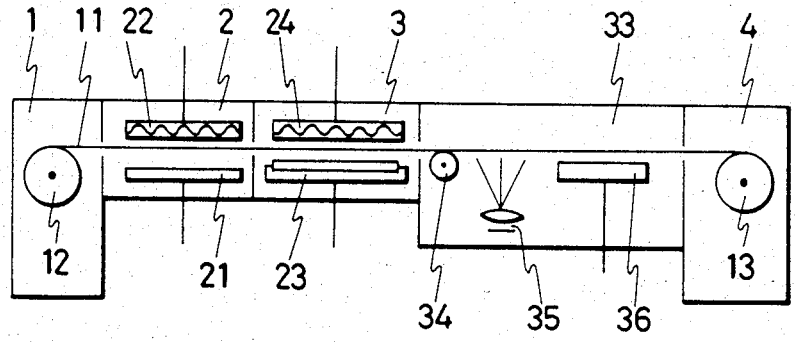

Instead of the apparatus shown in FIG. 3 or 5, which produce the patterned back electrode by using the mask, as shown in FIG. 7, the metallic substrate with the insulation layer and the back electrode may be supplied to an etching chamber 33, where a resist film is formed by printing on the back electrode by resist applying means 34. Alternatively, a resist film applied to the entire surface of the back electrode is exposed to light by exposure means 35 using a photomask (not shown) to form a pattern, followed by etching by plasma etching means 36 to pattern the back electrode.

Figure 8:
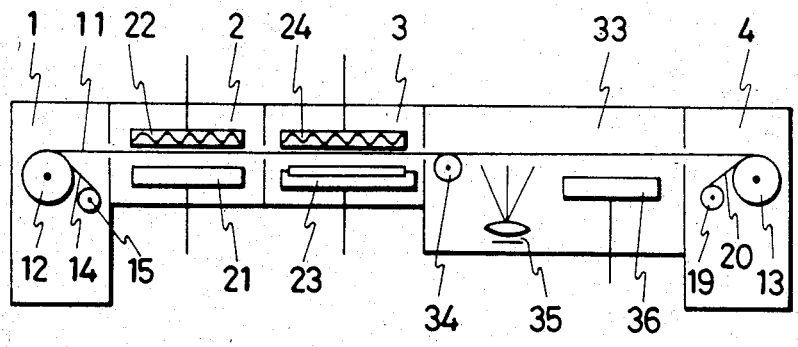
Figure 9:
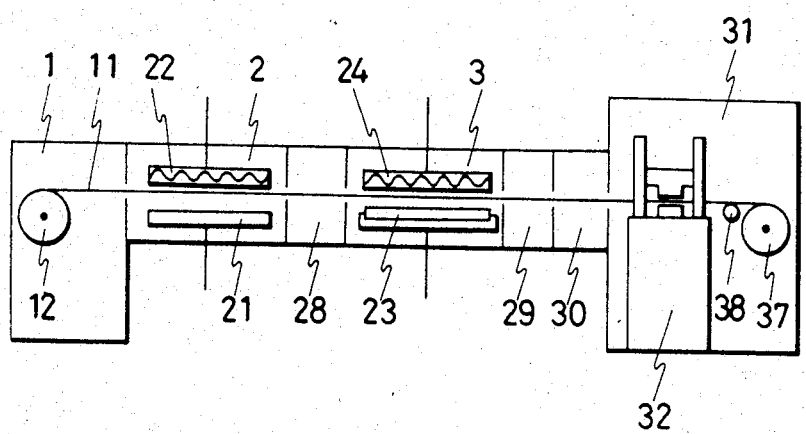

The apparatus shown in FIG. 7 may be assembled with the protective sheet winding means 15 and the protective sheet supplying means 19 as shown in FIG. 4 to provide an apparatus shown in FIG. 8.

Furthermore, a cutting chamber 31 may be provided with the aforementioned embodiments. In this embodiment, the metallic substrate 11 is fed successively through the plasma chamber 2, an intermediate chamber 28 for differential exhausting, the sputtering chamber 3 and intermediate chambers 29 and 30 for differential exhausting, and then is supplied in a form of continuous web to the cutting chamber 31. In the cutting chamber 31, the continuous product is cut to a predetermined size by cutting means 32 such as a press, etching or laser. In addition, when scrap forms, the scrap may be wound on a scrap winding roll 38 by an induction roll 38.

Figure 10:
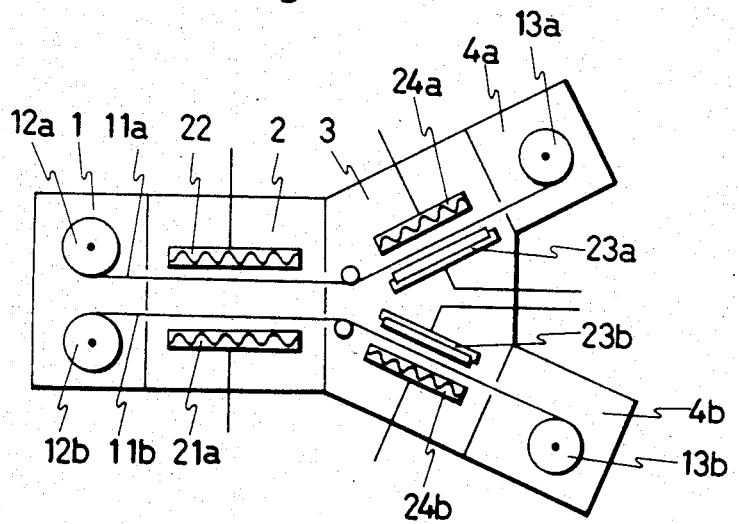

If the dc potential difference (Vb) between the RF electrode and the metallic substrate is controlled to 10 V or less, it is possible, as shown in FIG. 10, to form insulation layers on two metallic substrates 11a and 11b at a time. In this embodiment, two supply rolls 12a and 12b are installed in the plasma chamber 2, and plasma discharge is effected by using a single heater 22 and a single heater-containing RF electrode 21a. In addition, in FIG. 10, the heater-containing RF electrode 21a and heater 22 may be horizontally arranged one above the other between the substrates 11a and 11b. Alternatively, the heater-containing RF electrode 21a and heater 22 may be vertically arranged between the substrates 11a and 11b with the entire apparatus turned through 90°. The insulated substrates 11a and 11b with the insulation layer are supplied to the sputtering chamber 3 where back electrodes are formed on the respective insulation layers by electrode pairs 23a and 23b and heaters 24a and 24b. The products are wound on the winding rolls 13a and 13b in the winding chambers 4a and 4b.

Though the above-mentioned embodiments relate to the process of forming the insulation layer by plasma CVD method and subsequently forming the back electrode by a sputtering method, the insulation layer may be formed by sputtering method and the back electrode may be formed by a vapor deposition method.

According to the present invention, the insulation layer and the back electrode can be continuously formed on the continuous web of the metallic substrate by a single apparatus. Therefore, handling between individual steps is unnecessary, which can reduce time and labor and can obtain the desired product at a high speed and low cost. Further, because the process of the present invention can be carried out in closed system, there is no possibility of contamination by dust, which makes the yield increase. Further, the process can be automatically carried out because the steps can be continuously performed up to the patterning of the back electrode, and furthermore if desired, up to cutting.

What we claim is:

1. A process for producing a continuous web of an insulated metallic substrate, which comprises depositing an insulation layer of a non-monocrystalline material containing Si on a surface of a continuous web of a metallic substrate by a plasma CVD method using parallel plate electrodes, and without exposing the metallic substrate having the insulation layer thereon to atmospheric conditions successively depositing a back electrode directly on the insulation layer by a sputtering method or a vapor deposition method.

2. The process of claim 1, wherein said metallic substrate is made of iron, aluminum, nickel, copper, zinc, and an alloy thereof, stainless steel, brass or a surface-treated metal.

3. The process of claim 1, wherein said insulation layer contains at least one element selected from the group consisting of C, O, N and Ge.

4. The process of claim 1, wherein said insulation layer has a carbon content of not less than 10% by atom.

5. The process of claim 1, wherein said insulation layer is an amorphous material.

6. The process of claim 5, wherein said insulation layer is Si:H, $Si_{(1-x)}C_x$:H (wherein x is 0.1 to 0.9), $Si_{(1-x)}N$:H (wherein X is as difined above), $Si_{(1-x)}O_x$:H (wherein x is as defined above), $Si_{(1-x-y)}C_xN_y$:H (wherein x is as defined above, y is 0 to 0.9, and $x+y \leq 1$) or $Si_{(1-x-y)}C_xO_y$:H (wherein x and y are as defined above).

7. The process of claim 1, wherein said back electrode is a monolayer or a multiple layer of aluminum, chromium, nickel, molybdenum, copper, zinc, silver, tin, an alloy thereof, a metal oxide thereof, a titanium silver alloy, nichrome, SUS or ITO.

8. The process of claim 1, wherein said continuous web of the metallic substrate is a hoop material in roll.

9. The process of claim 1, wherein the surface of said metallic substrate is polished.

10. The process of claim 9, wherein the surface roughness of said substrate is $R_{max} \leq 0.5$ μm.

11. The process of claim 9, wherein the surface roughness of said substrate is $R_{max} \leq 0.2$ μm.

12. The process of claim 1, wherein said plasma CVD method is a parallel plate electrode method using an electrode having a magnet arranged so that a magnetic field component is parallel to the electrode plate.

13. The process of claim 12, wherein the deposition of said insulation layer is carried out at a substrate temperature of 100° to 400° C.

14. The process of claim 1, wherein the back electrode is deposited in a pattern by using a mask.

15. The process of claim 14, wherein the deposition of the back electrode is carried out at a substrate temperature of from room temperature to 400° C.

* * * * *